(12) United States Patent
Izawa et al.

(10) Patent No.: US 12,742,962 B2
(45) Date of Patent: Sep. 22, 2026

(54) OPTICAL DEVICE, SUBASSEMBLY OF OPTICAL DEVICE, AND METHOD OF MANUFACTURING OPTICAL DEVICE

(71) Applicant: FURUKAWA ELECTRIC CO., LTD., Tokyo (JP)

(72) Inventors: Atsushi Izawa, Tokyo (JP); Kazuya Nagashima, Tokyo (JP); Yozo Ishikawa, Tokyo (JP); Yusuke Inaba, Chiba (JP); Takuya Kokawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 476 days.

(21) Appl. No.: 18/350,936

(22) Filed: Jul. 12, 2023

(65) Prior Publication Data

US 2023/0359024 A1 Nov. 9, 2023

Related U.S. Application Data

(63) Continuation of application No. PCT/JP2022/001320, filed on Jan. 17, 2022.

(30) Foreign Application Priority Data

Jan. 25, 2021 (JP) ................................ 2021-009331

(51) Int. Cl.

| | |
|---|---|
| ***G02B 27/00*** | (2006.01) |
| ***H05K 5/02*** | (2006.01) |
| ***H05K 5/06*** | (2006.01) |
| ***H05K 5/10*** | (2025.01) |

(52) U.S. Cl.

CPC ....... *G02B 27/0012* (2013.01); *H05K 5/0209* (2022.08); *H05K 5/0217* (2013.01); *H05K 5/0247* (2013.01); *H05K 5/069* (2013.01); *H05K 5/10* (2025.01)

(58) Field of Classification Search

None

See application file for complete search history.

(56) References Cited

U.S. PATENT DOCUMENTS

| | | | | |
|---|---|---|---|---|
| 2004/0118599 | A1* | 6/2004 | Chason | H01L 24/73 257/E21.503 |
| 2020/0333639 | A1 | 10/2020 | Hirayama | |

FOREIGN PATENT DOCUMENTS

| | | | |
|---|---|---|---|
| JP | 58-118758 | U | 8/1983 |
| JP | 9-283886 | A | 10/1997 |
| JP | H09283886 | A * | 10/1997 |

(Continued)

OTHER PUBLICATIONS

International Search Report issued Apr. 12, 2022 in PCT/JP2022/001320 filed on Jan. 17, 2022 2 pages.

*Primary Examiner* — Shan Liu

(74) *Attorney, Agent, or Firm* — Oblon, McClelland, Maier & Neustadt, L.L.P.

(57) ABSTRACT

An optical device includes: a case; a wiring substrate that passes through the case and that includes an insulating member and a conductor; at least one of components including a first component configured to perform at least one of: outputting a light; receiving a light; and varying optical properties, and a second component configured to electrically control the first component, the at least one of components being housed in the case and flip-chip mounted on the wiring substrate.

8 Claims, 11 Drawing Sheets

(56) References Cited

FOREIGN PATENT DOCUMENTS

| | | | | |
|---|---|---|---|---|
| JP | 10-322049 | A | | 12/1998 |
| JP | H10322049 | A | * | 12/1998 |
| JP | 2000150096 | A | * | 5/2000 |
| JP | 2004134875 | A | * | 4/2004 |
| JP | 2004-181043 | A | | 7/2004 |
| JP | 2004221876 | A | * | 8/2004 |
| JP | 2020-178117 | A | | 10/2020 |

* cited by examiner

OPTICAL DEVICE, SUBASSEMBLY OF OPTICAL DEVICE, AND METHOD OF MANUFACTURING OPTICAL DEVICE

This application is a continuation of International Application No. PCT/JP2022/001320, filed on Jan. 17, 2022 which claims the benefit of priority of the prior Japanese Patent Application No. 2021-009331, filed on Jan. 25, 2021, the entire contents of which are incorporated herein by reference.

BACKGROUND

The present disclosure relates to an optical device, a subassembly of the optical device, and a method of manufacturing the optical device.

In the related art, an optical device is known that includes a feed-through which passes through a case (for example, refer to Japanese Patent Application Laid-open No. 2020-178117). A feed-through includes an insulating body and a plurality of terminals passing through the insulating body, and represents an assembly of terminals meant for securing electrical conduction between the inside and the outside of the case.

SUMMARY

Regarding this type of optical device, for example, if it becomes possible to achieve a new and improved configuration by which the number of components may be reduced and the optical device may be further downsized, it would be beneficial.

There is a need for an optical device having a new and improved configuration, a subassembly of the optical device and a method of manufacturing the optical device.

According to one aspect of the present disclosure, there is provided an optical device including: a case; a wiring substrate that passes through the case and that includes an insulating member and a conductor; at least one of components including a first component configured to perform at least one of: outputting a light; receiving a light; and varying optical properties, and a second component configured to electrically control the first component, the at least one of components being housed in the case and flip-chip mounted on the wiring substrate.

BRIEF DESCRIPTION OF THE DRAWINGS

FIG. 4 is an illustrative and schematic cross-sectional view of some portion of an optical device according to a third embodiment;

FIG. 9 is an illustrative and schematic exploded cross-sectional view of some portion of an optical device according to an eighth embodiment, and is a diagram illustrating the assembly of a subassembly with respect to a case;

DETAILED DESCRIPTION

Figure 1:
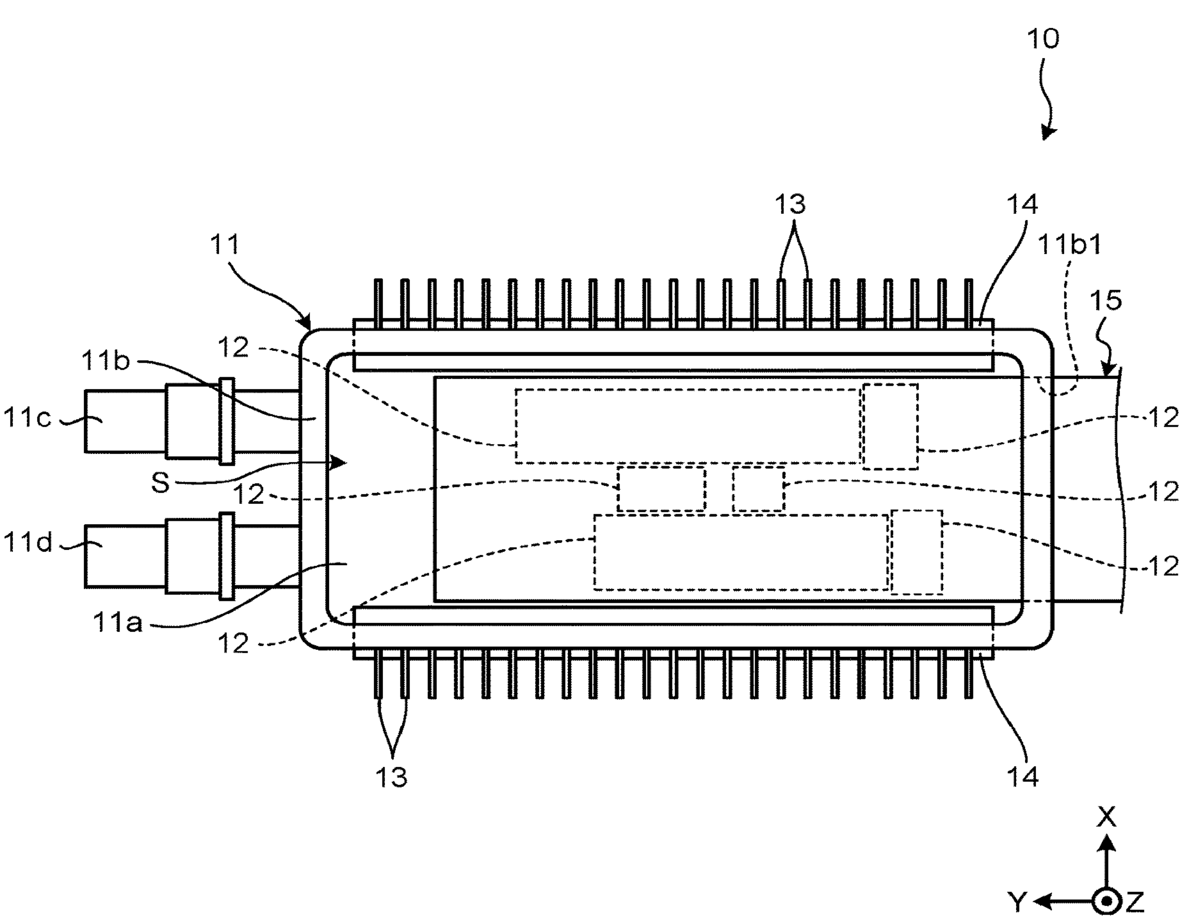
FIG. 1 is an illustrative and schematic planar view of an internal configuration of an optical device according to to first embodiment.

Exemplary embodiments are described below. The configurations explained in the embodiments described below as well as the actions and the results (effects) attributed to the configurations are only exemplary. Thus, the present disclosure may be implemented also using some different configuration than the configurations disclosed in the embodiments described below. Meanwhile, according to the present disclosure, it becomes possible to achieve at least one of various effects (including secondary effects) that are attributed to the configurations.

The embodiments described below include identical constituent elements. In the following explanation, the identical constituent elements are referred to by the same reference numerals, and their explanation is not given in a repeated manner.

In the present written description, ordinal numbers are assigned only for convenience and with the aim of differentiating among the components, among the parts, and among the directions. Thus, the ordinal numbers do not indicate the priority or the sequencing.

Moreover, in the drawings, the X direction is indicated by an arrow X, the Y direction indicated by an arrow Y, and the Z direction is indicated by an arrow Z. The X direction, the Y direction, and the Z direction intersect with each other and are orthogonal to each other.

First Embodiment

FIG. 1 is a planar view of an internal configuration of an optical device 10. FIG. 1 is a diagram in which the optical device 10 is viewed from the opposite direction to the Z direction in the state in which a plate-like lid (not illustrated), which is positioned at the end portion in the Z direction of a case 11 of the optical device 10, has been removed.

As illustrated in FIG. 1, the optical device 10 includes the case 11, a plurality of components 12, a plurality of external connection pins 13, a feed-through 14, and a wiring substrate 15.

The case 11 includes a bottom wall 11_a_, a peripheral wall 11_b_, ports 11_c_ and 11_d_, and the lid (not illustrated). The bottom wall 11_a_ has a substantially quadrangular shape and a plate-like shape. The bottom wall 11_a_ intersects with the Z direction and extends along the X and Y directions. The peripheral wall 11*b* has a substantially constant thickness and extends from the edge of the bottom wall in the Z direction. The peripheral wall 11*b* may also be called a sidewall.

The lid of the case 11 has a substantially quadrangular shape and a plate-like shape. The rim of the lid overlaps, in the Z direction, with the end edge in the Z direction of the peripheral wall lib. When the rim of the lid and the end edge in the Z direction of the peripheral wall 11*b* are bonded together, a storage chamber S gets formed inside the case 11 for housing the components 12 and the wiring substrate (e.g., flexible substrate) 15. The storage chamber S may be sealed in an airtight manner. Moreover, an inert gas may be filled in the storage chamber S.

The bottom wall 11*a* may be made from a material having high thermal conductivity, such as copper-tungsten (CuW), copper-molybdenum (CuMo), or aluminum oxide ($Al_2O_3$). Moreover, the peripheral wall 11*b* and the lid may be made from a material having a low coefficient of heat expansion, such as an Fe—Ni—Co alloy or aluminum oxide ($Al_2O_3$).

The ports 11*c* and 11*d* have a cylindrical shape and protrude, from some portion of the peripheral wall 11*b*, in a lateral direction, that is, in the Y direction in the example illustrated in FIG. 1. Of the ports 11*c* and 11*d*, one port is an input port, and the other port is an output port. An input optical fiber passes through the input port, and an output optical fiber passes through the output port. The space between the ports 11*c* and 11*d* and the peripheral wall 11*b* is sealed in an airtight manner, and the spaces between the ports 11*c* and 11*d* and the respective optical fibers are also sealed in an airtight manner.

The components 12 are housed inside the storage chamber S, that is, inside the case 11. At least one of the components 12 is flip-chip mounted on the wiring substrate 15. The other components 12 are attached to a cooling mechanism (not illustrated) that is installed above or on the bottom wall 11*a*. In that case, the other components 12 are electrically connected either to the conductor wiring of the wiring substrate 15 or to the external connection pins 13 via some other conductor (not illustrated) such as a bump, or the conductor of a flexible printed circuit board, or a bonding wire.

The components 12 are energized from the outside of the case 11. That is, the components 12 receive the supply of electrical power from the outside of the case 11. Each component 12 is either a first component meant for outputting a light, receiving (detecting) a light, and varying the optical properties such as the intensity, the wavelength, the modulating frequency, the polarization state, and the interference state; or is a second component that electrically controls the operations of at least one first component. That is, each component 12 is either an electrically-operating optical component or an electrical component. Examples of the component 12 representing a first component include a chip on submount (a light emitting unit), a wavelength locker representing a wavelength detector, a photodiode representing an optical receiver, a photodiode array, a modulator, a modulation driver, a coherent mixer, a transimpedance amplifier, a heater (a heating mechanism), and a thermoelectric cooler (TEC). Examples of the component 12 representing a second component include a controller that is a computer and an integrated circuit for controlling the operations of other electrical components or electronic components. Meanwhile, in the storage chamber S are also housed the optical components that do not operate electrically (not illustrated), such as a lens, a mirror, a beam combiner, a beam splitter, and an optical isolator.

The external connection pins 13 are attached to the feed-through 14. The external connection pins 13 extend in the X direction and are arranged in the Y direction with a gap maintained therebetween. In the first embodiment, a single array of the external connection pins 13 arranged in the Y direction is positioned at the end portion in the X direction of the peripheral wall 11*b* and is placed along the portion (sidewall) extending in the Y direction; and another single array of the external connection pins 13 arranged in the Y direction is positioned at the end portion in opposite direction to the X direction and is placed along the portion (sidewall) extending in the Y direction. The external connection pins 13 may be made from a metallic material having high electrical conductivity, such as a copper base metal or an aluminum base metal. A copper base metal may be copper or a copper alloy, and an aluminum base metal may be aluminum or an aluminum alloy. To each external connection pin 13, a conductor having external wiring (not illustrated) is either mechanically connected or electrically connected.

The feed-through 14 includes conductors and an insulating member, and passes through the peripheral wall 11*b* of the case 11. The conductors of the feed-through 14 may be made from a metallic material having high electrical conductivity, such as a copper base metal. The conductors of the feed-through 14 along with the external connection pins 13, which are electrically connected to those conductors, constitute external connection conductors. The insulating member of the feed-through 14 may be made from an insulating material such as ceramic. The boundary between the feed-through 14 and the case 11 is sealed in an airtight manner.

The wiring substrate 15 passes through the peripheral wall 11*b* and extends across the inside and the outside of the case 11. The wiring substrate 15 has a quadrangular and plate-like shape; and intersects with the Z direction and extends along the X and Y direction. In the first embodiment, the wiring substrate 15 passes through, in the Y direction, the portion at the end part in the Y direction of the peripheral wall 11*b* of the case 11. Meanwhile, the peripheral wall 11*b* represents an example of a first wall.

The wiring substrate 15 is a printed circuit board that includes an insulation layer and a plurality of conductor wirings. The insulation layer is made from an insulating material such as ceramic, glass, a synthetic resin material, or a mixed material thereof. The conductor wirings are made from a metallic material having high electrical conductivity, such as a copper base metal. In the first embodiment, the wiring substrate 15 is a rigid board. However, that is not the only possible case. Alternatively, the wiring substrate 15 may be a flexible board, or may be a rigid flexible board.

Figure 2:
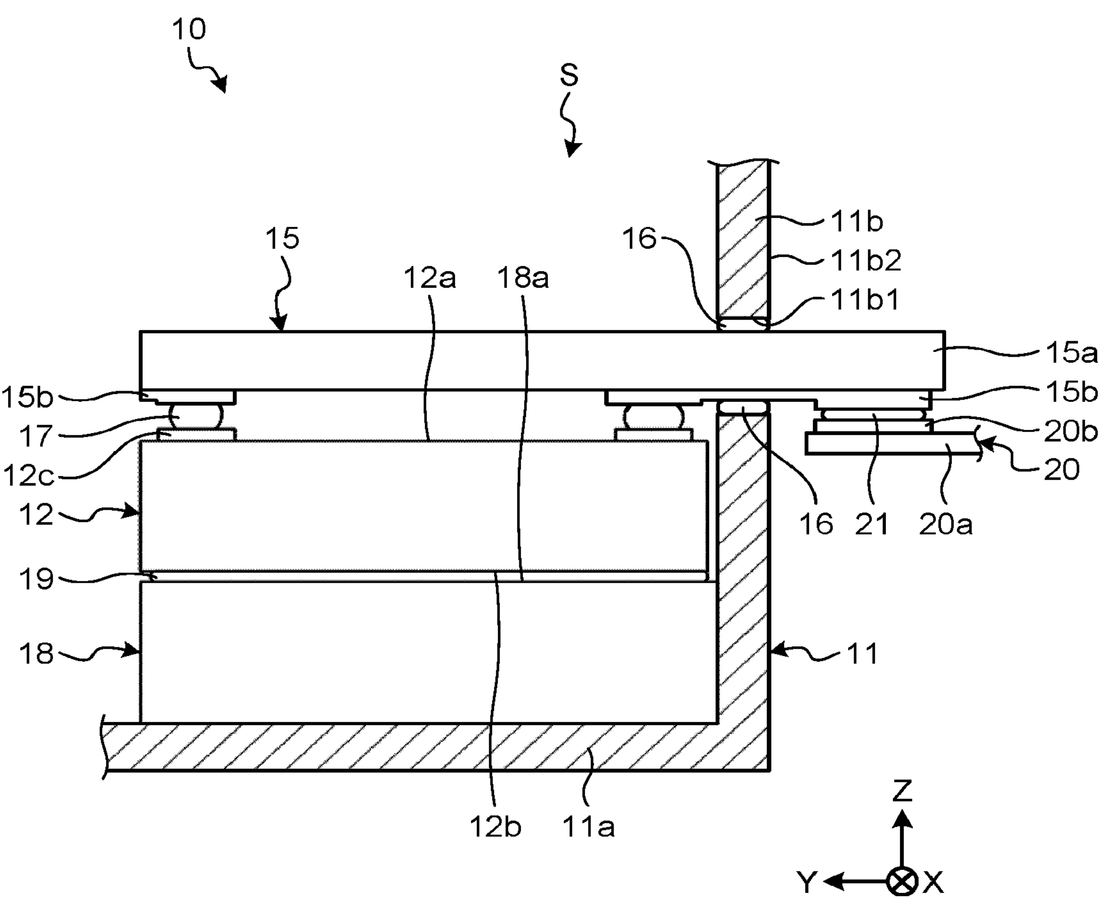
FIG. 2 is an illustrative and schematic cross-sectional view of some portion of the optical device according to the first embodiment.

FIG. 2 is a cross-sectional view of the cross-sectional surface intersecting with the X direction of the optical device, and includes a side view of some components. As illustrated in FIG. 2, the optical device 10 includes a heat transferring member 18.

The wiring substrate 15 passes through an opening 11*b*1 that is formed on the peripheral wall 11*b* of the case 11. The opening 11*b*1 is a through hole formed through the peripheral wall 11*b* in the Y direction, and has the shape of a slit extending in the X direction. In between the opening 11*b*1 and the wiring substrate 15, a junction material 16 is provided for bonding the edge of the opening 11*b*1 and the wiring substrate 15. Thus, using the junction material 16, the gap between the edge of the opening 11*b*1 and the wiring substrate 15 is sealed in an airtight manner.

The wiring substrate 15 includes an insulation layer 15*a* and conductor wirings 15*b*. In the first embodiment, the conductor wirings 15b are exposed on the surface positioned at the end portion in at least the opposite direction to the Z direction of the insulation layer 15a. The insulation layer 15a represents an example of an insulating member, and the conductor wirings 15b represent examples of a conductor.

The wiring substrate 15 is a rigid board. For example, the wiring substrate 15 may be a single-sided board, a double-sided board, a multi-layer board, or a buildup board.

The components 12 are positioned in between the wiring substrate 15 and the bottom wall 11a, and are flip-chip mounted on the wiring substrate 15. That is, of each component 12, an electrode 12c installed on a face 12a facing the wiring substrate 15 is mechanically and electrically connected to a pad of the corresponding conductor wiring 15b via a junction material 17. The junction material 17 is a conductor such as a bump or a ball. For example, the junction material 17 is a solder ball.

The wiring substrate 15 is separated from the bottom wall 11a of the case 11 in the Z direction. In between the components 12, which are mounted on the wiring substrate 15, and the bottom wall 11a; heat transferring members 18 and 19 are provided via which the components 12 are thermally connected to the bottom wall 11a. As a result, the heat generated due to the operations performed by the components 12 may be discharged to the outside of the optical device 10 via the heat transferring member 19 and the bottom wall 11a. The bottom wall 11a intersects with the peripheral wall 11b, and represents an example of a second wall.

The heat transferring member 18 is a block made from a metallic material having high thermal conductivity, such as a copper base material; and may also be referred to a heat releasing block. The heat transferring member 18 is bonded to the bottom wall 11a in a substantially coherent state using welding or adhesion. The heat transferring member 18 is thermally connected to the bottom wall 11a.

The heat transferring member 19 is provided between a face 12b of the concerned component 12, which is on the opposite side of the face 12a, and a face 18a of the heat transferring member 18, which is on the opposite side of the bottom wall 11a. The heat transferring member 19 is, for example, an adhesive agent having high thermal conductivity. In this case, since the heat transferring member 19 is present in a pre-solidification fluid state between the concerned component 12 and the heat transferring member 18, it becomes possible to absorb the variability in the gap between the component 12 and the heat transferring member 18. The heat transferring member 19 may be a heat conducting sheet that has thermal conductivity, that is flexible, and that is deformable. In that case, due to the deformation of the heat transferring member 19, it becomes possible to absorb the variability in the gap between the concerned component 12 and the heat transferring member 18.

The heat transferring member 18 is substantially coherent also with the peripheral wall 11b. That is, in the first embodiment, the components 12 are thermally connected also to the peripheral wall 11b via the heat transferring members 18 and 19. As a result, as compared to the case in which the components 12 are thermally connected only to the bottom wall 11a, the heat generated due to the operations performed by the components 12 may be more easily discharged to the outside of the optical device 10.

Each conductor wiring 15b of the wiring substrate 15 is electrically connected to a conductor wiring 20b of an external substrate 20 provided on the outside of the case 11 via a junction material 21. The external substrate 20 is a wiring substrate that includes an insulation layer 20a and the conductor wirings 20b; and represents a rigid board or a flexible board. For example, the external substrate 20 may be a transceiver substrate meant for transmitting electrical signals such as RF signals having a relatively higher frequency. In that case, electrical signals having a relatively higher frequency are transmitted to the conductor wiring 20b, the junction material 21, and the conductor wiring 15b of the wiring substrate 15.

Meanwhile, in between the external connection pins 13 and the other components 12 not illustrated in FIG. 2, for example, direct-current power or an electrical signal having a relatively lower frequency is transmitted via some other conductors other than the conductors in the feed-through 14.

As explained above, in the first embodiment, the wiring substrate 15 on which the components 12 are flip-chip mounted passes through the peripheral wall 11b of the case 11. Herein, it may be said that the wiring substrate 15 is formed when a feed-through or an interface substrate is integrated with a wiring substrate disposed inside the case 11 (the storage chamber S). As a result of such integration, for example, it becomes possible to reduce the number of components of the optical device 10. Meanwhile, alternatively, a single wiring substrate 15 illustrated in FIG. 1 and two field-throughs 14 may be integrated into a single wiring substrate.

Moreover, in the first embodiment, the wiring substrate 15 is a rigid substrate. With such a configuration, for example, at the time of assembling the optical device 10, the wiring substrate 15 may be handled with more ease.

Second Embodiment

Figure 3:
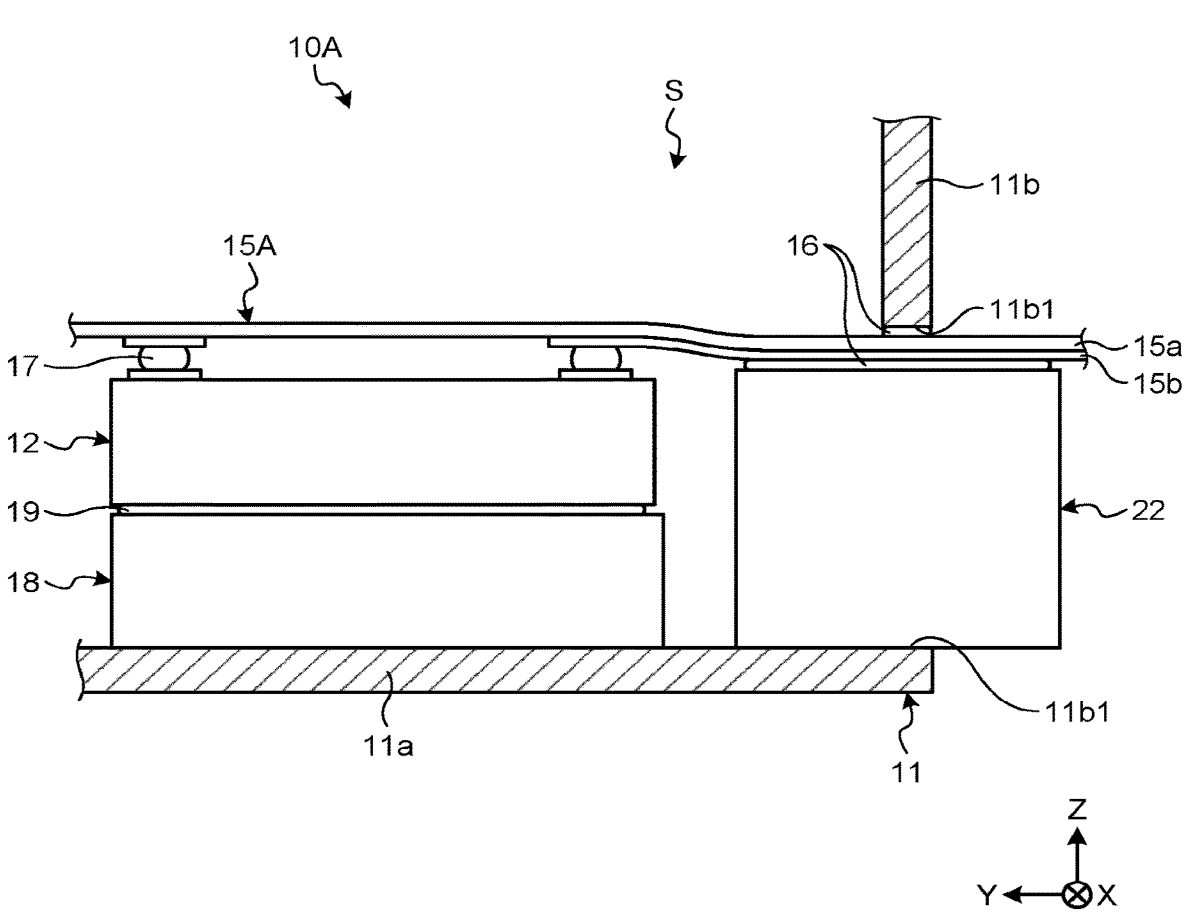
FIG. 3 is an illustrative and schematic cross-sectional view of some portion of an optical device according to a second embodiment.

FIG. 3 is a cross-sectional view of the cross-sectional surface intersecting with the X direction of an optical device 10A according to a second embodiment, and includes a side view of some components. As illustrated in FIG. 3, the optical device 10A includes a supporting member 22 that supports a wiring substrate 15A. The supporting member 22 passes through the opening 11b1 formed on the peripheral wall 11b. That is, the supporting member 22 has a portion housed in the case 11 and a portion exposed to the outside of the case 11. The supporting member 22 is bonded in a substantially coherent manner to the bottom wall 11a using welding or adhesion. In between the wiring substrate 15A and the supporting member 22, the junction material 16 is filled.

In the second embodiment, the wiring substrate 15A is a flexible substrate. With such a configuration, for example, it becomes possible to enhance the freedom in the layout of the wiring substrate 15A inside the storage chamber S, and to absorb the dimensional variability in the components attributed to the bend (curve) of the wiring substrate 15A.

Third Embodiment

Figure 4:
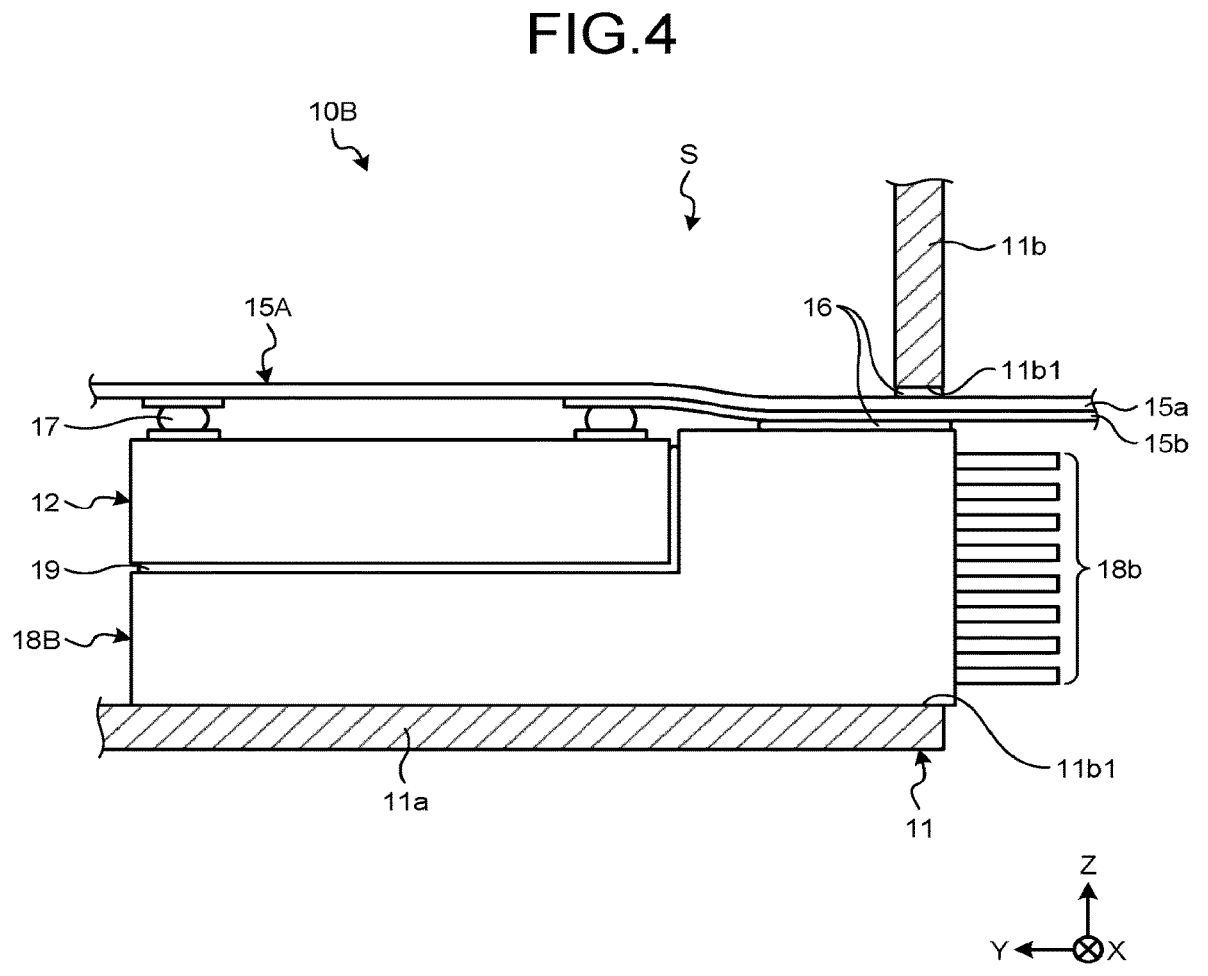

FIG. 4 is a cross-sectional view of the cross-sectional surface intersecting with the X direction of an optical device 10B according to a third embodiment, and includes a side view of some components. As illustrated in FIG. 4, in the optical device 10B, a heat transferring member 18B supports the wiring substrate 15A and passes through the opening 11b1 formed on the peripheral wall 11b. The heat transferring member 18B includes a portion housed in the case 11, and includes a heat releasing unit 18b exposed to the outside of the case 11. The heat releasing unit 18b includes, for example, a plurality of fins, a plurality of pins, and an uneven structure. With such a configuration, due to the heat releasing unit 18*b* having a larger surface area, it becomes possible to enhance the heat dissipation from the heat transferring member 18B. As a result, the heat generated due to the operations performed by the components 12 may be discharged to the outside of the optical device 10B with more ease.

Meanwhile, via the heat transferring member 19, the heat transferring member 18B is thermally connected also to the lateral face positioned at the end portion in the opposite direction to the Y direction of the concerned component 12. With such a configuration, for example, since the heat transferring member 18B is thermally connected to a plurality of faces of the concerned component 12, the amount of heat transferred from the concerned component 12 to the heat transferring member 18B may be increased, thereby making it further easier to discharge the heat, which is generated due to the operations performed by the component 12, to the outside of the optical device 10B.

Fourth Embodiment

Figure 5:
FIG. 5 is an illustrative and schematic cross-sectional view of some portion of an optical device according to a fourth embodiment.
Figure 5:
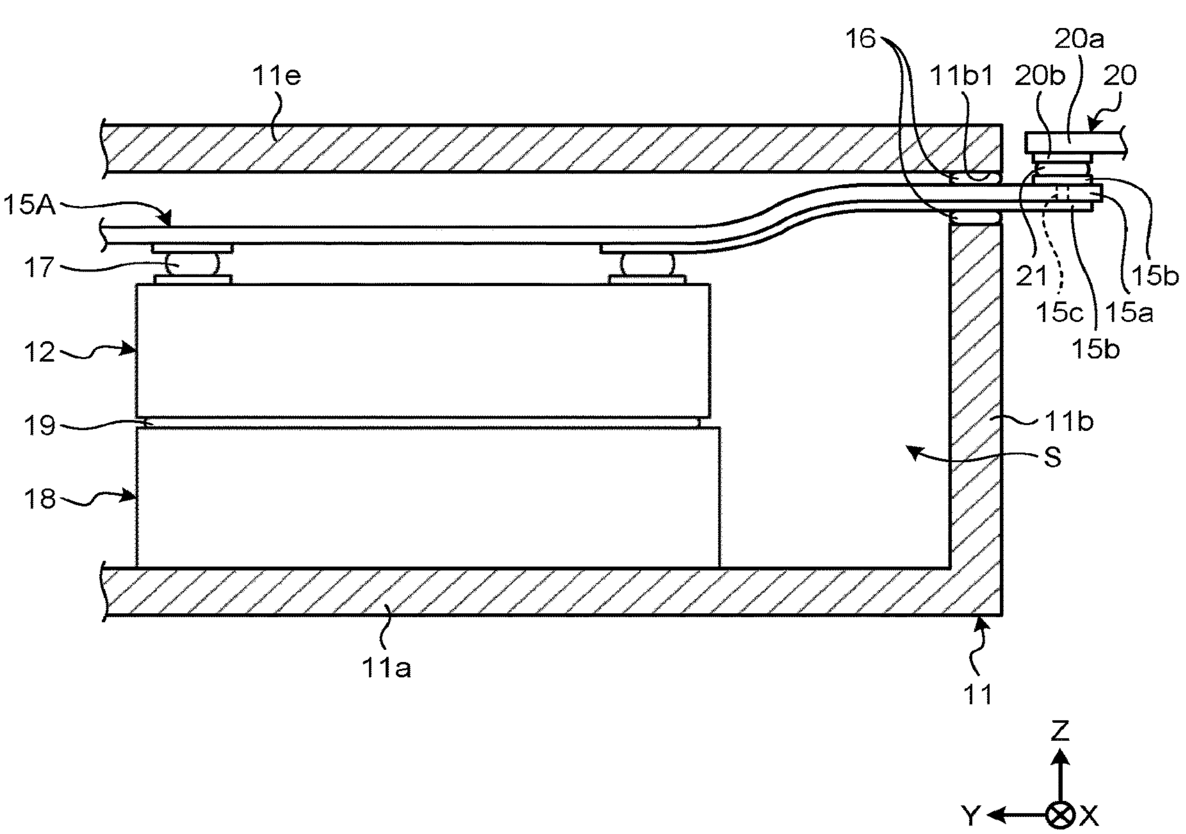

FIG. 5 is a cross-sectional view of the cross-sectional surface intersecting with the X direction of an optical device 10C according to a fourth embodiment, and includes a side view of some components. As illustrated in FIG. 5, in the optical device 10C, the opening 11*b*1 is formed at the boundary portion between the end portion in the Z direction of the peripheral wall 11*b* and an apex wall 11*e* serving as the lid of the case 11. In that case, the opening 11*b*1 may be formed in between a notch formed at the end portion in the Z direction of the peripheral wall 11*b* and the apex wall 11*e*. In this way, the opening 11*b*1 may be formed at the boundary of two members that constitute the case 11. With such a configuration, for example, since a notch may be formed while forming the end portion of the peripheral wall lib, as compared to the case in which the opening 11*b*1 is separately formed on the peripheral wall lib, the time and efforts as well as the cost of manufacturing the case 11, and in turn manufacturing the optical device 10C, may be reduced.

The wiring substrate 15A may include a through conductor 15*c* that is electrically connected to the conductor wiring 15*b* and that passes through the wiring substrate 15A in the thickness direction. The through conductor 15*c* represents an example of a conducting member and may also be referred to as conductor wiring. Alternatively, the wiring substrate 15A may include the through conductor 15*c* positioned inside the storage chamber S. As a result of having the through conductor 15*c*, for example, on the opposite side to the side on which the components 12 are mounted on the wiring substrate 15A, it becomes possible to connect the conductor wiring 15*b* with other conductors and the components 12. Hence, it becomes possible to have a more efficient layout of the components 12 and the conductors inside the storage chamber S.

Fifth Embodiment

Figure 6:
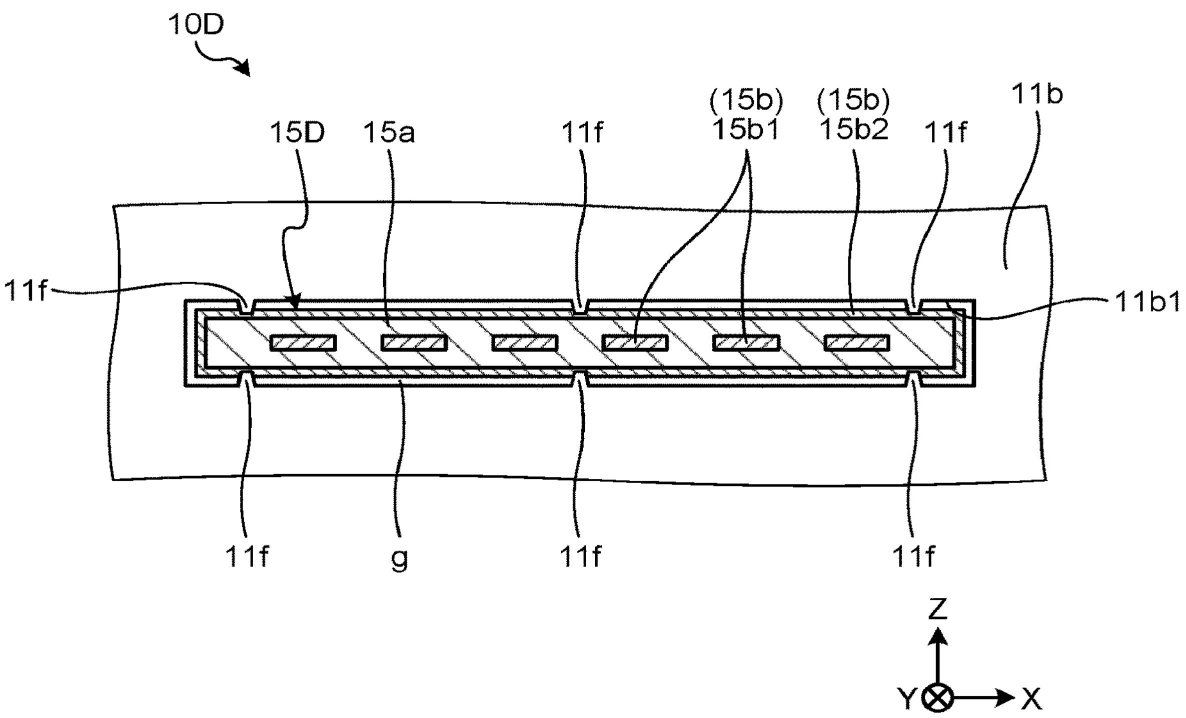
FIG. 6 is an illustrative and schematic side view (partial cross-sectional view) of some portion of an optical device according to a fifth embodiment.

FIG. 6 is a cross-sectional view in the Y direction of an optical device 10D according to a fifth embodiment, and includes a side view of a wiring substrate 15D. As illustrated in FIG. 6, in the fifth embodiment, on the edge of the opening 11*b*1, nail-shaped protrusions 11*f* are formed that protrude toward the inside of the opening 11*b*1. The wiring substrate 15D engages with the protrusions 11*f* and gets positioned in the Y direction. The protrusions 11*f* may engage with the wiring substrate 15D in a digging manner toward the inside of the wiring substrate 15D, or may engage with the wiring substrate 15D in an abutting manner with the recession or the step (not illustrated) formed on the surface of the wiring substrate 15D. With such a configuration, for example, the wiring substrate 15D may be positioned and fixed with respect to the case 11 with more ease.

In the fifth embodiment, a gap g is maintained between the edge of the opening 11*b*1 and the wiring substrate 15D. When there is no need of airtight sealing of the storage chamber S, the gap g may be left as it is. Alternatively, as explained in the earlier embodiments, the gap g may be filled with the junction material 16 (see FIGS. 1 to 5).

Moreover, on the surface of the wiring substrate 15D, at least in the portion that passes through the opening 11*b*1, an external conductor 15*b*2 of the conductor wiring 15*b* is disposed to enclose the surrounding of the insulation layer 15*a*. The external conductor 15*b*2 may be a ground conductor that is electrically connected to the ground terminal (not illustrated) of the optical device 10D. Moreover, inside the insulation layer 15*a*, internal conductors 15*b*1 of the conductor wiring 15*b* are disposed. The internal conductors 15*b*1 are surrounded by the insulation layer 15*a*.

With such a configuration, for example, the insulation property of the internal conductors 15*b*1 may be easily secured using the insulation layer 15*a*, and the noise resistance of the internal conductors 15*b*1 may be enhanced using the external conductor 15*b*2. Moreover, if the external conductor 15*b*2 and the peripheral wall 11*b* are made from a metallic material; then, as the junction material 16 to be filled in the gap g, for example, it becomes possible to use a junction material such as a solder that has high affinity to the external conductor 15*b*2 as well as the peripheral wall 11*b*. In that case, for example, the gap g may be filled with the junction material 16 with more ease or with more reliability.

Sixth Embodiment

Figure 7:
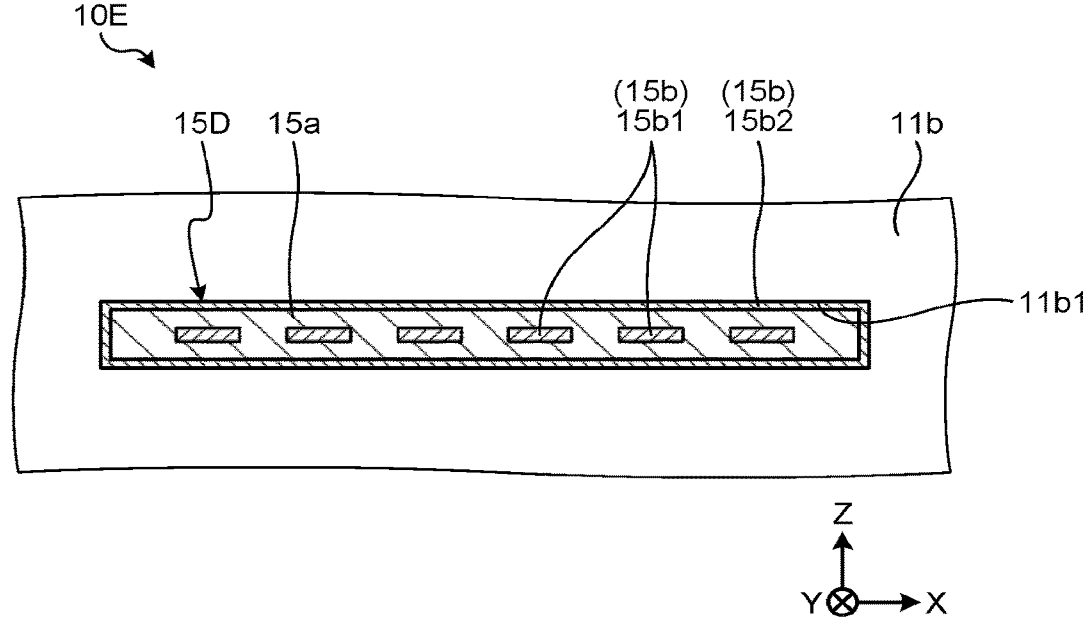
FIG. 7 is an illustrative and schematic side view (partial cross-sectional view) of some portion of an optical device according to a sixth embodiment.

FIG. 7 is a cross-sectional view in the Y direction of an optical device 10E according to a sixth embodiment, and includes a side view of the wiring substrate 15D. As illustrated in FIG. 7, according to the sixth embodiment, the wiring substrate 15D is press-fit in the opening 11*b*1. With such a configuration, for example, the junction material 16 and the protrusions 11*f* are no more required, thereby making it possible to reduce the number of components of the optical device 10E and to reduce the time and efforts during manufacturing.

Seventh Embodiment

Figure 8:
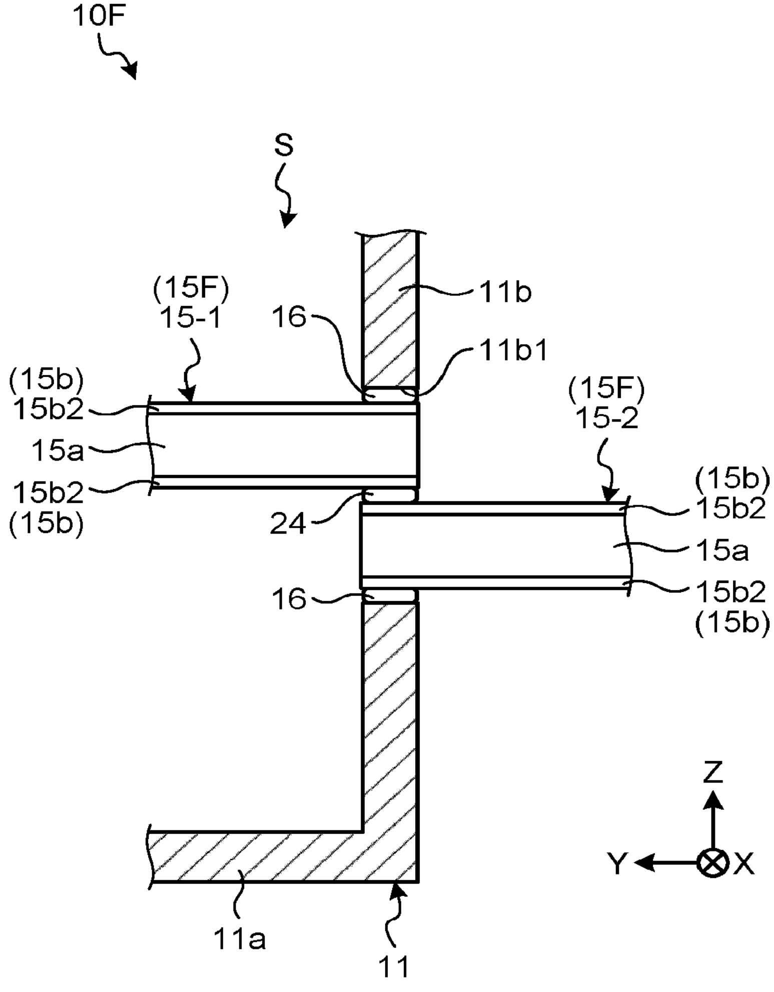
FIG. 8 is an illustrative and schematic cross-sectional view of some portion of an optical device according to a seventh embodiment.

FIG. 8 is a cross-sectional view in the Y direction of an optical device 10F according to a seventh embodiment, and includes a side view of a wiring substrate 15F. As illustrated in FIG. 8, according to the seventh embodiment, the wiring substrate 15F includes two wiring substrates 15-1 and 15-2 that are coupled together. The wiring substrate 15-1 as well as the wiring substrate 15-2 includes external conductors 15*b*2 on both sides in the thickness direction (the Z direction) of the insulation layer 15*a* and at least in the portion positioned inside the opening 11*b*1. The external conductors 15*b*2 that are adjacent to each other in the Z direction are mechanically and electrically connected using a junction material 24 having electrical conductivity. As a result, the wiring substrates 15-1 and 15-2 are integrated. The junction material 24 may be a solder made from a material that has high affinity to the external conductors 15*b*2. Meanwhile, the edge of the opening 11*b*1 and the wiring substrate 15F are bonded using the junction material 16. In that case, the junction material 16 and the junction material 24 may be made from the same material. The wiring substrates 15-1 and 15-2 may be coupled inside the opening **11*b*1. With such a configuration, for example, the airtight sealing between the edge of the opening 11*b*1 and the wiring substrate 15F may be performed with more ease or with more reliability using the junction materials 16 and 24**.

Eighth Embodiment

Figure 9:
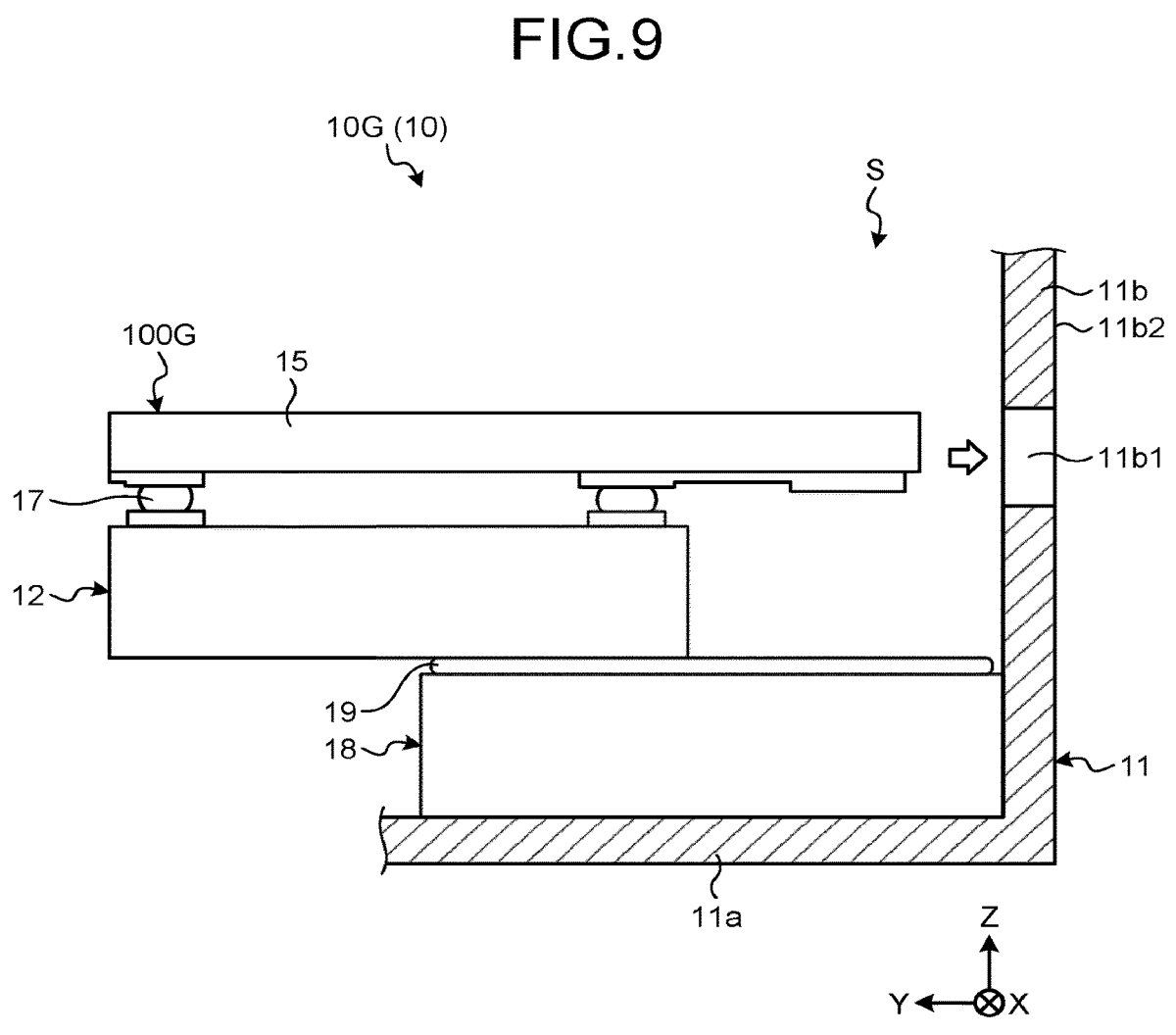

FIG. 9 is a cross-sectional view in the Y direction of an optical device 10G (10) according to an eighth embodiment, and includes a side view of the wiring substrate 15. In FIG. 9 is illustrated the state in which a subassembly 100G and the case 11 are yet to be assembled. The optical device 10G according to the seventh embodiment includes the same constituent elements as the constituent elements of the optical device 10 according to the first embodiment.

In the eighth embodiment, firstly, the subassembly 100G is manufactured by mounting the component 12 on the wiring substrate 15. At that time, for example, the component 12 is flip-chip mounted on the wiring substrate 15. The subassembly 100G is configured to be attachable to the peripheral wall **11*b* of the case 11**.

Subsequently, as illustrated in FIG. 9, in the state of the subassembly 100G, the wiring substrate 15 is inserted into the opening **11*b*1 on the peripheral wall 11*b* of the case 11; and, as soon as a predetermined positional relationship is achieved, the subassembly 100G is fixed to the case 11 using the junction material 16 and the heat transferring member 19. In that predetermined positional relationship, the components 12 are positioned on the opposite side of an outer face 11*b*2 of the case 11 with reference to the peripheral wall 11*b*. As a result, the subassembly 100G gets integrated with some portion of the case 11, and then that portion of the case 11 is assembled with the remaining portion. With such a configuration, for example, the component 12 may be mounted on the wiring substrate on the outside of the case 11. Thus, as compared to the case in which the component 12 is mounted on the wiring substrate 15 inside the case 11, the component 12 may be mounted with more ease, or with more speed, or with more reliability. Meanwhile, the peripheral wall 11*b* represents an example of a wall of the case 11**.

When the subassembly 100G is configured to be attachable to the peripheral wall **11*b* of the case 11; it implies that, in the state in which the wiring substrate 15 has passed through the opening 11*b*1 formed on the peripheral wall 11*b*, the wiring substrate 15, the component 12, and the case 11 (the peripheral wall 11*b*) satisfy a predetermined positional relationship in the optical device 10 (10**G).

Ninth Embodiment

Figure 10:
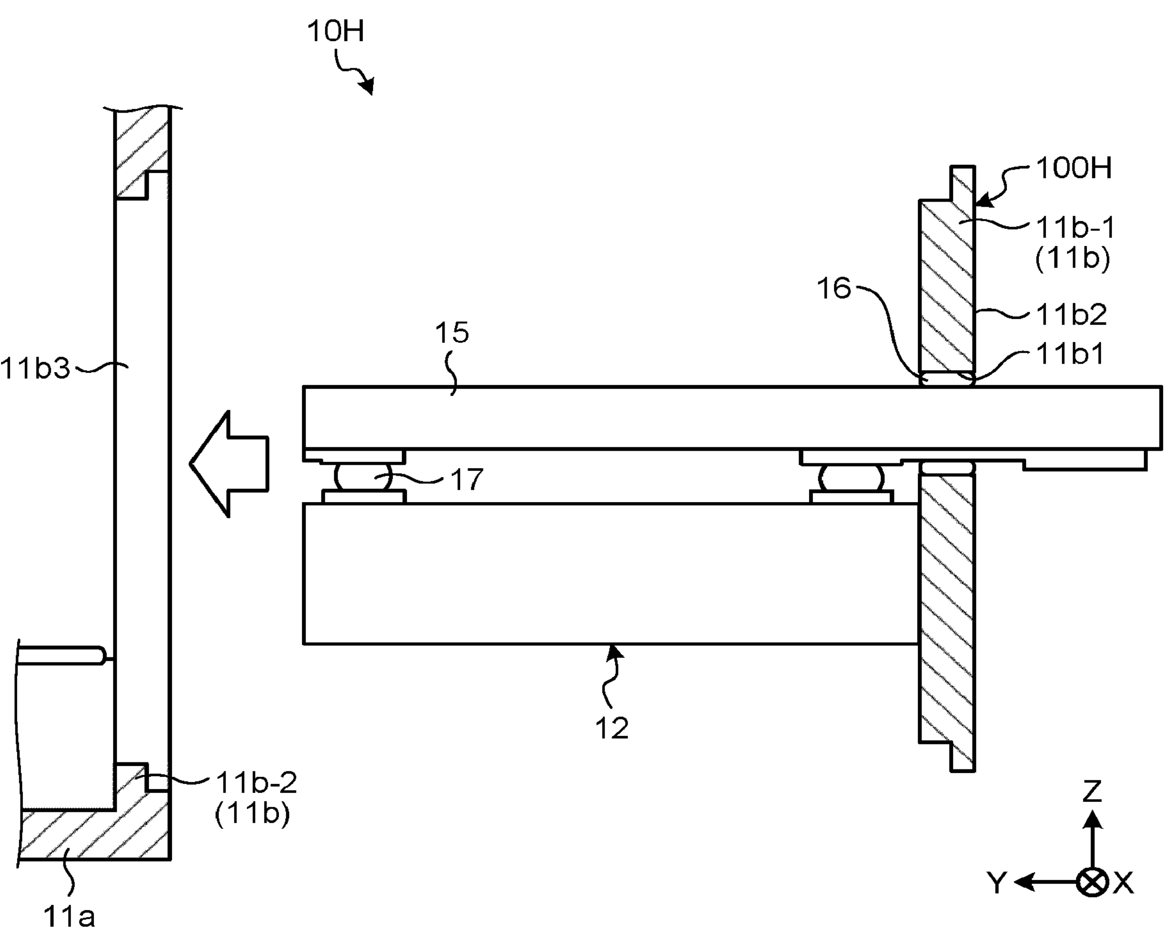
FIG. 10 is an illustrative and schematic exploded cross-sectional view of some portion of an optical device according to a ninth embodiment, and is a diagram illustrating the assembly of a subassembly with respect to a case.
Figure 11:
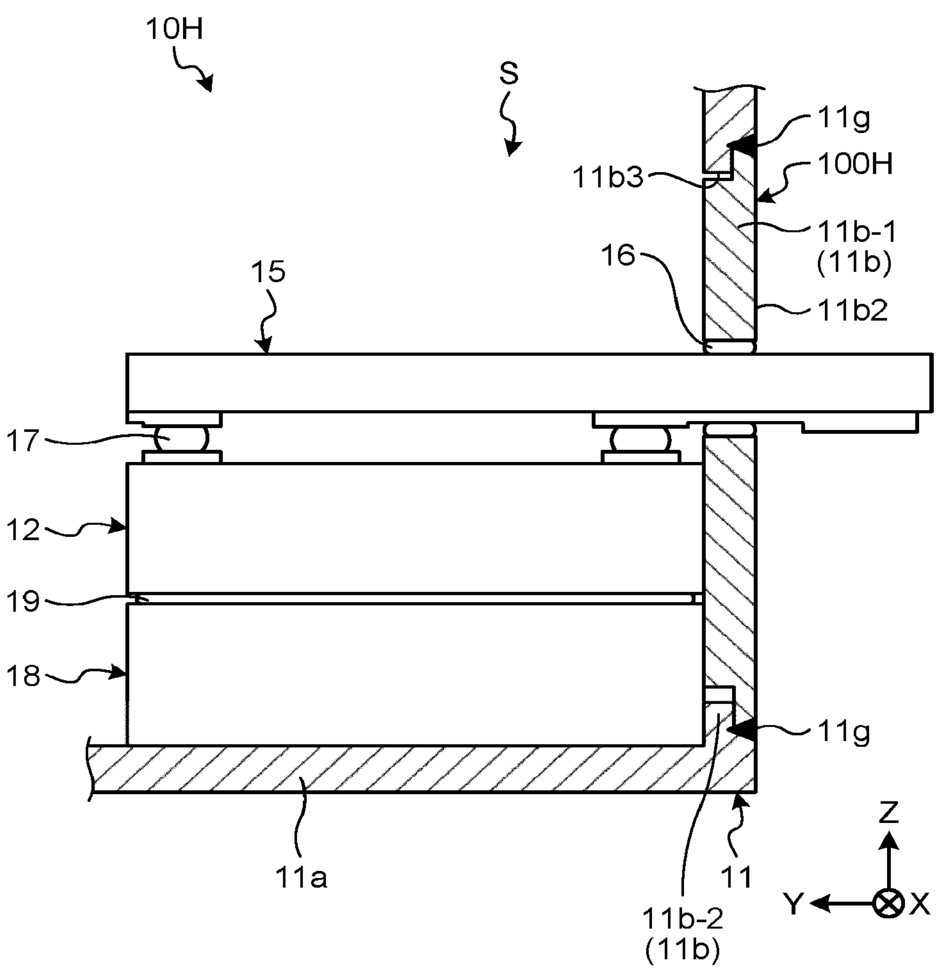
FIG. 11 is an illustrative and schematic cross-sectional view of some portion of the optical device according to the ninth embodiment.

FIG. 10 is an exploded cross-sectional view in the Y direction of an optical device 10H according to a ninth embodiment, and includes a side view of the wiring substrate 15. In FIG. 10 is illustrated the state in which a subassembly 100H and the case 11 are yet to be assembled. FIG. 11 is an exploded cross-sectional view in the Y direction of the optical device 10H. In FIG. 11 is illustrated the state in which the subassembly 100H and the case 11 are assembled.

In the ninth embodiment too, firstly, the component 12 is mounted on the wiring substrate 15. At that time, for example, the component 12 is flip-chip mounted on the wiring substrate 15. Moreover, the wiring substrate 15 passes through the opening **11*b*1 that is formed on a first portion 11*b*-1 representing a part of the peripheral wall 11*b*; and, as soon as a predetermined positional relationship is achieved, the wiring substrate 15 and the first portion 11*b*-1 are integrated using the junction material 16. As a result, the subassembly 100H illustrated in FIG. 10 is formed. That is, the subassembly 100H according to the ninth embodiment includes some portion of the wall of the case 11, in addition to including the wiring substrate 15 and the components 12. In that predetermined positional relationship, the component 12 is positioned on the opposite side to the outer face 11*b*2 of the case 11 with reference to the first portion 11*b*-1. Herein, the first portion 11*b*-1** represents an example of a first wall.

Subsequently, as illustrated in FIGS. 10 and 11, in the state of the subassembly 100H, the first portion **11*b*-1 of the peripheral wall 11*b* and a second portion 11*b*-2 of the peripheral wall 11*b* are bonded by welding in welding portions 11*g*, so that the subassembly 100H gets integrated with the case 11 excluding the first portion 11*b*-1. The first portion 11*b*-1 and the second portion 11*b*-2 are configured to be attachable to each other. In the ninth embodiment, as an example, in the boundary region between the first portion 11*b*-1 and the second portion 11*b*-2, a fitting structure made of textured patterns is provided. As a result, during the process of integrating the subassembly 100H with the case 11 excluding first portion 11*b*-1, a predetermined positional relationship between the first portion 11*b*-1 and the second portion 11*b*-2 may be achieved with more ease, or with more speed, or with more reliability. According to the ninth embodiment too, for example, in an identical manner to the eighth embodiment, the component 12 may be mounted on the wiring substrate 15 with more ease, with more speed, or with more reliability. Meanwhile, as long as the attachable configuration is such that the first portion 11*b*-1 and the second portion 11*b*-2 are linked in an integrated manner to constitute the case 11**, it serves the purpose. Thus, the fitting structure is not a mandatory structure.

10-th Embodiment

Figure 12:
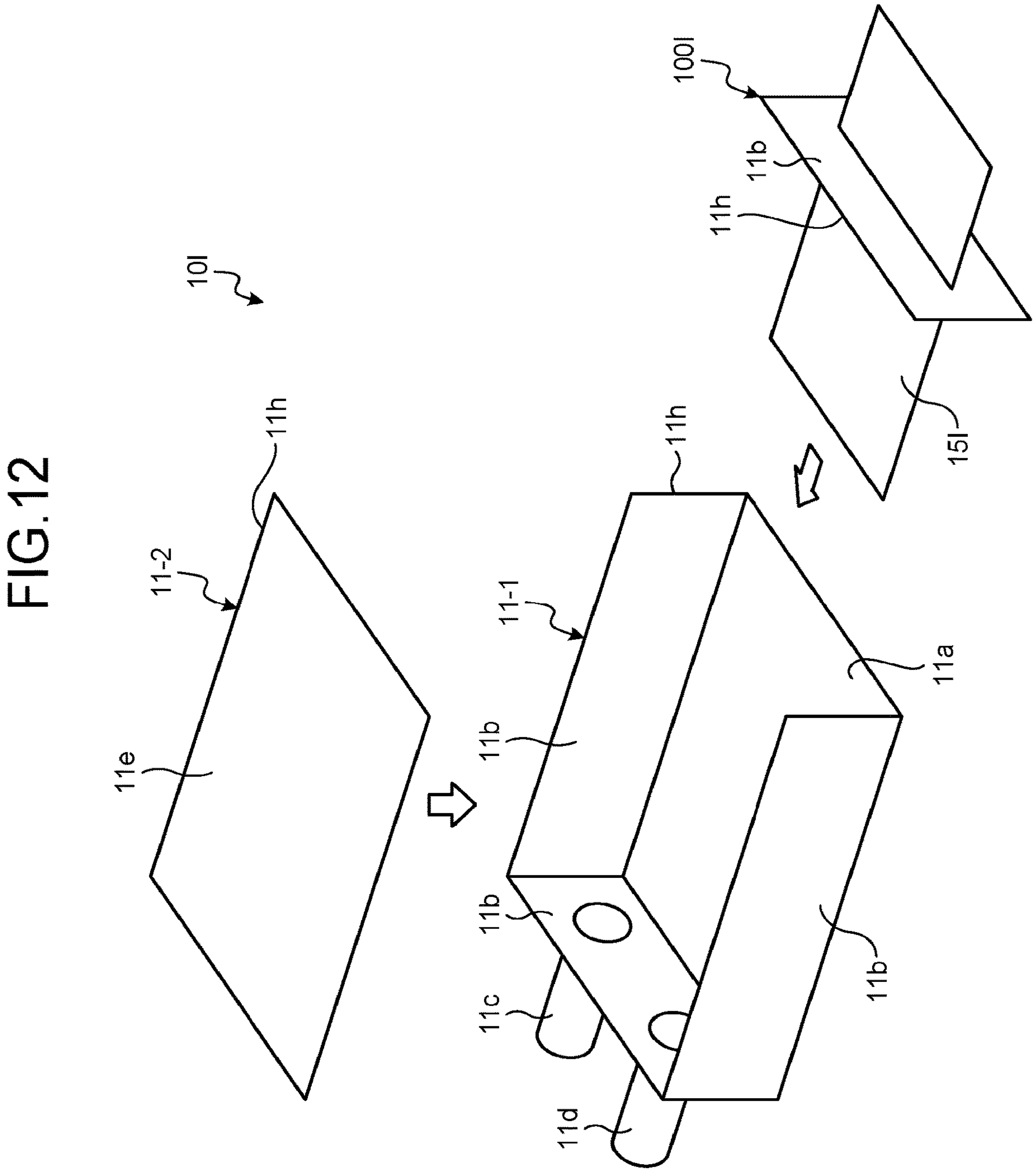
FIG. 12 is an illustrative and schematic cross-sectional view of some portion of an optical device according to a 10-th embodiment.

FIG. 12 is an exploded perspective view of an optical device 10I according to a 10-th embodiment. As illustrated in FIG. 12, in the 10-th embodiment, a subassembly 100I includes a sidewall representing some portion of the peripheral wall **11*b* and includes a wiring substrate 15I on which the components 12 (not illustrated in FIG. 12) are flip-chip mounted. Moreover, the case 11 includes the bottom wall 11*a*; a first divided portion 11-1 including the peripheral wall 11*b* not included in the subassembly 100I; and a second divided portion 11-2 including the apex wall 11*e* serving as the lid. The peripheral wall 11*b* of the subassembly 100I is configured to be attachable to the bottom wall 11*a*, the peripheral wall lib, and the apex wall 11*e* included in the first divided portion 11-1 or the second divided portion 11-2. Herein, as long as the attachable configuration is such that the walls are linked in an integrated manner to constitute the case 11**, it serves the purpose. Thus, a fitting structure is not mandatory.

When the subassembly 100I, the first divided portion 11-1, and the second divided portion 11-2 are bonded together, the optical device 10I is obtained. In the 10-th embodiment, some portion of the peripheral wall **11*b* included in the subassembly 100I represents an example of a first wall and a first portion. Moreover, the bottom wall 11*a*, the peripheral wall lib, and the apex wall 11*e* included in the first divided portion 11-1** or the second divided portion represent an example of a second portion.

In the 10-th embodiment, at the time of assembling the first divided portion 11-1 and the second divided portion 11-2; the portion in which an edge 11*h* of the bottom wall 11*a* of the case 11, an edge 11*h* of the peripheral wall 11*b* of the case 11, and an edge 11*h* of the apex wall 11*e* of the case 11 may be butted is linearly welded, so that the optical device 10I may be configured. As far as linear welding is concerned, it is possible to implement various welding methods such as roller seam welding or laser welding. With such a configuration, for example, the components 12 may be mounted on the wiring substrate 15I with more ease or with more reliability, and the optical device 10I may be formed with more ease.

While certain embodiments have been described, these embodiments and modification examples have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. Moreover, regarding the constituent elements, the specifications about the configurations and the shapes (structure, type, direction, shape, size, length, width, thickness, height, number, arrangement, position, material, etc.) may be suitably modified.

For example, the first portion may include a plurality of walls of the case, and the second portion too may include a plurality of walls of the case.

According to the present disclosure, it becomes possible to achieve an optical device having a new and improved configuration, and to achieve a subassembly of the optical device and a method of manufacturing the optical device.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical device comprising:

a case that includes a first wall and a second wall that intersects with the first wall;

a wiring substrate that is a flexible substrate, that passes through the first wall and that includes an insulating member and a conductor;

at least one of components including a first component configured to perform at least one of: outputting a light; receiving a light; and varying optical properties, and a second component configured to electrically control the first component, the at least one of components being housed in the case and flip-chip mounted on the wiring substrate; and a heat transferring member that passes through the first wall, supports the wiring substrate at a position that the wiring substrate passes through the first wall, and is arranged between the at least one of components and the second wall, the heat transferring member thermally connecting the at least one of components and the second wall.

2. The optical device according to claim 1, wherein the heat transferring member includes a flexible heat transferring member.

3. An optical device comprising:

a case;

a wiring substrate that is a flexible substrate, that passes through the case and that includes an insulating member and a conductor;

at least one of components including:

a first component configured to perform at least one of: outputting a light; receiving a light; and varying optical properties, and a second component configured to electrically control the first component, the at least one of components being housed in the case and flip-chip mounted on the wiring substrate; and a supporting member that passes through the case and that supports the wiring substrate at a position that the wiring substrate passes through the case, wherein the wiring substrate passes through an opening formed on the case, and the optical device further comprises a junction material configured to bond an edge of the opening and the wiring substrate.

4. The optical device according to claim 3, wherein the wiring substrate passes through an opening formed on the case, and the case includes a protrusion configured to protrude from an edge of the opening and engage with the wiring substrate.

5. The optical device according to claim 3, wherein the wiring substrate passes through an opening formed on the case, and a space between the wiring substrate and an edge of the opening is sealed in airtight manner.

6. A subassembly of an optical device having a case, comprising:

a wiring substrate that is a flexible substrate, that passes through the case through an opening formed on the case and that includes an insulating member and a conductor;

at least one of components including a first component configured to perform at least one of: outputting a light; receiving a light; and varying optical properties, and a second component configured to electrically control the first component, the at least one of components being housed in the case and flip-chip mounted on the wiring substrate;

a supporting member that passes through the case and that supports the wiring substrate at a position that the wiring substrate passes through the case; and a junction material configured to bond an edge of the opening and the wiring substrate, wherein the subassembly of the optical device is configured to be attachable to the case and the at least one of the components is positioned on an opposite side to an outer face of the case with reference to the wall.

7. A subassembly of an optical device having a case, comprising:

a first portion that is a portion of the case for housing an optical component, the first portion including a first wall;

a wiring substrate that is a flexible substrate, that includes an insulating member and a conductor and that is fixed to the first wall in a state in which the wiring substrate has passed through the first wall through an opening formed on the first wall;

at least one of components including a first component configured to perform at least one of: outputting a light; receiving a light; and varying optical properties, and a second component configured to electrically control the first component, the at least one of components being mounted on the wiring substrate, and positioned on an opposite side to an outer face of the case with respect to the first wall; and a supporting member that passes through the first wall and that supports the wiring substrate at a position that the wiring substrate passes through the first wall, and a junction material configured to bond an edge of the opening and the wiring substrate, wherein the subassembly of the optical device is configured to be attachable to a second portion of the case that is different from the first portion.

8. A method of manufacturing an optical device, the method comprising:

preparing a subassembly by mounting, on a wiring substrate, at least one of components including: a first component configured to perform at least one of: outputting a light; receiving a light; and varying optical properties; and a second component configured to electrically control the first component; and fixing the subassembly and a case of the optical device to each other in a state in which the wiring substrate passes through an opening formed on a wall of the case, and the at least one of components is positioned on an opposite side to an outer face of the case with respect to the wall, wherein the wiring substrate is a flexible substrate, a supporting member passes through the case and supports the wiring substrate at a position that the wiring substrate passes through the case, and a junction material bonds an edge of the opening and the wiring substrate.

* * * * *